(12) United States Patent
Mitchell

(10) Patent No.: US 6,426,459 B1
(45) Date of Patent: Jul. 30, 2002

(54) EMI SHIELDING VENT PANEL FOR HIGH VOLUME APPLICATIONS

(75) Inventor: Jonathan E. Mitchell, Norwood, MA (US)

(73) Assignee: Parker-Hannifin Corporation, Cleveland, OH (US)

(*) Notice: Subject to any disclaimer, the term of this patent is extended or adjusted under 35 U.S.C. 154(b) by 0 days.

(21) Appl. No.: 09/620,453

(22) Filed: Jul. 20, 2000

Related U.S. Application Data

(60) Provisional application No. 60/149,339, filed on Aug. 17, 1999.

(51) Int. Cl.[7] ................................................. H05K 9/00
(52) U.S. Cl. ........................ 174/35 MS; 174/35 R; 361/692; 361/693; 361/816; 454/184
(58) Field of Search ....................... 174/35 R, 35 MS; 361/816, 818, 692, 693; 454/184

(56) References Cited

U.S. PATENT DOCUMENTS

| | | | |
|---|---|---|---|
| 3,546,359 A | 12/1970 | Ciccarelli | |
| 3,553,343 A | 1/1971 | Garlington | |
| 3,580,981 A | 5/1971 | Lamp | |
| 3,584,134 A | 6/1971 | Nichols | |
| 3,821,463 A | 6/1974 | Bakker | |
| 4,249,033 A | 2/1981 | Darakjy et al. | |
| 4,616,101 A | * 10/1986 | Veerman et al. | ........ 174/35 MS |
| 5,007,946 A | 4/1991 | Babini | |
| 5,032,689 A | 7/1991 | Halligan et al. | |
| 5,202,536 A | 4/1993 | Buonanno | .............. 174/35 GC |
| 5,401,914 A | 3/1995 | Curran et al. | |
| 5,640,869 A | 6/1997 | Takeda et al. | ................. 72/129 |
| 5,895,885 A | 4/1999 | Kunkel | |
| 5,910,639 A | 6/1999 | Kunkel | |

FOREIGN PATENT DOCUMENTS

| | | |
|---|---|---|
| EP | WO 97/32459 | 9/1971 |
| JP | 8-64988 | 3/1996 |
| JP | 08064988 | 8/1996 |

OTHER PUBLICATIONS

Chomerics, Parker–Hannifin Engineering Handbook titled "EMI Shielding for Military/Aerospace Electronics" copyrighted 1996.
Copy of International Search Report in corresponding International Application No. PCT/US00/19700.

* cited by examiner

Primary Examiner—Dean A. Reichard
Assistant Examiner—Hung V Ngo
(74) Attorney, Agent, or Firm—John A. Molnar, Jr.

(57) ABSTRACT

An electromagnetic interference (EMI) shielded vent panel construction for disposition over an opening of an electronics enclosure. The panel includes an electrically-conductive media having an outer periphery supported within an electrically-conductive frame. The frame is configured as including an elongate end wall, and a pair of oppositely-disposed side walls. Each of the side walls has an outer surface, one of which is disposable about the opening of the enclosure in electrically-conductive adjacency with the surface thereof, and an inner surface spaced-apart from the inner surface of the other of the side walls. The outer periphery of the media is retained intermediate the inner surfaces of the side walls. At least one of the side walls is formed as having a series of spaced-apart first tabs defined therein along the perimeter of the frame, each of the first tabs having a proximal end and a downwardly-depending distal end which contacts the corresponding edge portion of the media effective to provide electrical contact between the frame and the media.

17 Claims, 7 Drawing Sheets

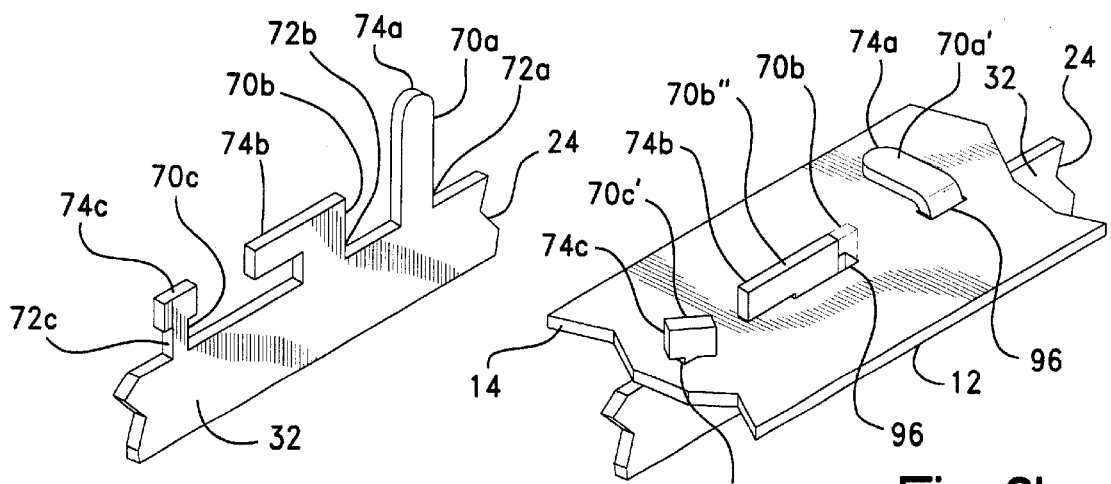
Fig. 8a
Fig. 8b
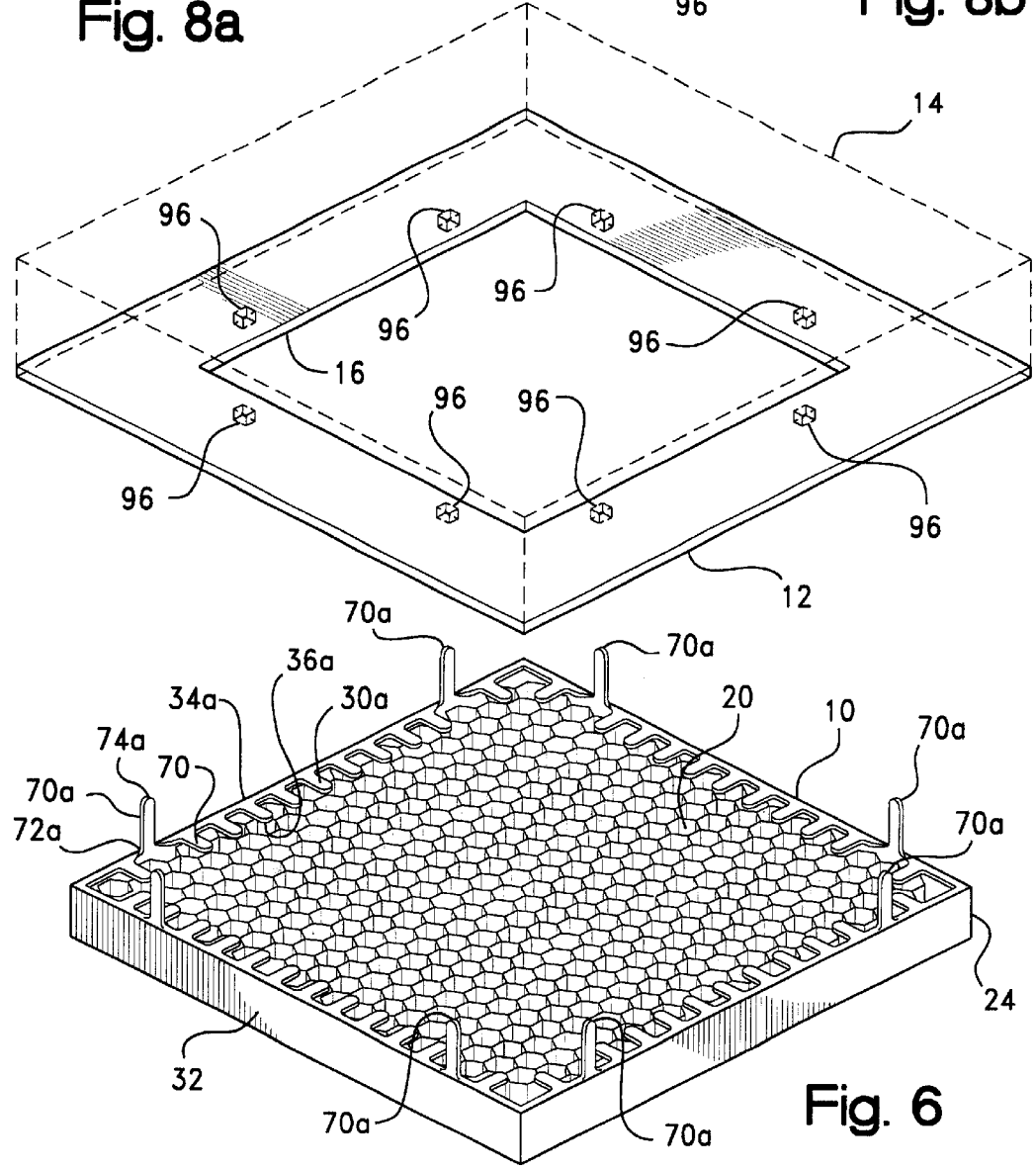
Fig. 6

EMI SHIELDING VENT PANEL FOR HIGH VOLUME APPLICATIONS

RELATED CASES

The present application claims priority to U.S. Provisional Application Ser. No. 60/149,339; filed Aug. 17, 1999.

BACKGROUND OF THE INVENTION

The present invention relates broadly to an electromagnetic interference (EMI) shielding or grounding panel assembly including a porous, electrically-conductive shielding media and an electrically-conductive frame for supporting the media, and more particularly to such an assembly which is adapted to cover a corresponding ventilation opening in an electronics housing or other enclosure enclosures and which accommodates the flow of cooling air into the enclosure while maintaining electrical continuity and EMI shielding effectiveness across the opening.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices. "EMI" is used herein interchangeably with the term "radio frequency interference" ("RFI").

For attenuating EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure, such as a room, which surrounds the EMI generating circuitry of the source device. However, when such circuitry is contained within the confined space of an enclosure, it often is necessary to provide a cooling or ventilation means to dissipate the heat which is ohmicly or otherwise generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been proposed for covering the openings in an manner which allows for the ventilation of the enclosure while electrical continuity, i.e., grounding, across the vent opening is maintained. In basic construction, such vent panels, which are sized to span the corresponding opening in the enclosure, conventionally are formed as including a sheet of a porous, electrically-conductive shielding media, and an electrically-conductive frame member configured to support the media as extending about the outer periphery thereof. The media, which may be an expanded metal mesh or, alternatively, a honeycombed-structured or other cellular structured metal foil, is received in or is otherwise attached to the frame, which typically is provided as an extruded aluminum or other metal profile. The frame, in turn, may be fastened to the enclosure over the opening thereof with screws or the like, with a compressible, electrically-conductive seal or gasket optionally provided for improved electrical contact between the frame and the enclosure.

However, for electrical continuity to be maintained across the opening, good electrical contact must be provided not only as between the frame and the enclosure, but also as between the media and the frame. In this regard, conventional panels may employ a C-shaped frame channel including a V-shaped or other projection or edge integrally formed within one of the sides of the channel. With the periphery of the media being received within the channel, the sides thereof are compressed to cause the projection or edge to penetrate into the media and thereby establish good electrical contact. Vent panels of such type are marketed commercially by the Chomerics Division of Parker-Hannifin Corp. (Woburn, Mass. under the tradenames "Cho-Cell™," "Shield Cell®," and "Omni Cell®." Alternatively, the media may be fit into the frame and then bonded thereto using a conventional joining technique such as resistance welding, brazing, soldering, or the like.

Another method of attaching the media to the frame involves using the gasket typically provided between the frame and the enclosure to hold the filter media in place. As is described in commonly-assigned U.S. Pat. No. 5,032,689, the frame in such method may be integrally-formed as including a ridge over which the gasket is press-fitted for its retention about the periphery of the frame. The gasket, in turn, may be configured to overlap the media for securing the media to the frame.

U.S. Pat. No. 3,580,981 discloses another shielding vent panel wherein an electrically conductive textile is positioned about the periphery of the media for contact between the media and the frame which may have an L-shaped or generally Z-shaped profile. To assure good conductivity, the frame, media, and textile are covered with an electrically-conductive coating or plating such as by immersion in a molten tin or metal bath.

U.S. Pat. No. 4,616,101 discloses a vent including a grating which is arranged in a rectangular metal frame having an L-shaped cross-section that is bent into a U-shape. The grating is clamped between a flange of the frame and supporting feet of a mounting spring. The supporting feet are stamped into the mounting spring, which itself is provided as a strip of metal which is bent rectangularly four times, and are bent into a "V-shape."

Other vents and materials therefor are described in U.S. Pat. Nos. 3,546,359; 3,553,343; 3,584,134; 3,821,463; 4,249,033; 4,616,101; 5,007,946; 5,401,914; 5,895,885; and 5,910,639, JP 8064988, and WO 97/32459.

In view of the proliferation of electronic devices, it is to be expected that continued improvements in EMI shielded vent panels would be well-received by industry, and particularly by the designers of enclosures for personal computers, file servers, telecommunication equipment, and similar systems which now operate at frequencies of 500 MHz or more. Indeed, as the clock speeds of electronic devices continue to increase with the attendant generation of higher frequency EMI radiation and greater heat output, enclosure designers are faced with the seemingly competing requirements of providing both adequate ventilation and effective EMI shielding. In such applications, a honeycomb shielding media, such as is disclosed in U.S. Pat. Nos. 3,821,463; 5,895,885; 5,910,639, would be considered preferred over other media as known to provide effective EMI shielding at higher frequencies with less restriction to air flow. Such materials, however, are relatively expensive and heretofore were believed cost-prohibitive in high volume applications such as personal computers. A preferred vent construction therefore would be economical to manufacture, but also would exhibit both reliable EMI shielding performance and good ventilation in high frequency applications.

BROAD STATEMENT OF THE INVENTION

The present invention is directed to an EMI shielded vent construction including an electrically-conductive frame member having a generally U- or C-shaped profile including end wall portions and a pair of side wall portions integral with the end wall portion, and an electrically-conductive, porous shielding media member, which is supported by the frame member. At least one of the side wall portions is provided as having a plurality of spaced-apart, finger-like tabs or projections defined therein. The tabs, which are oriented to depend downwardly from the side wall portion for projection into the media, both retain the media within the frame and provide electrical contact with the media. In a preferred construction, the projection of the tabs into the media effects the compression thereof to provide a greater surface area for electrical contact with the frame.

Advantageously, the provision of the economical tabs obviates the need to integrally form a contact projection within the frame member, and thus allows the frame member to be constructed of a stamped metal sheet or roll-formed channel rather than of a more costly extrusion profile. The use of a stamped sheet or a roll formed channel, moreover, allows the frame to be formed by drawing, stamping, folding, or other cold working operation, and thereby eliminates the need for welds at the frame member corners. For reasons of cost and performance, the frame typically will be formed of aluminum or another metal, with the media being formed of one or more layers of a cellular aluminum or other metal foil honeycomb.

In one disclosed embodiment, the tabs are formed to define the periphery of the corresponding side wall portion of the frame. Such construction advantageously facilitates the manufacture of the frame from a polygonal stamping or other generally-planar metal sheet having an outer margin defined by the tabs and an inner margin which may be generally linear. With the corners of the sheet being notched, the sheet is folded intermediate its inner and outer margins into an L-shaped configuration wherein the tabs are oriented generally vertically relative to the opposing side wall. The media then is inserted into the partially-formed frame, and the tabs are folded downwardly, such as in a press or the like, into the media. Optionally, one or more tabs, each of which may be sized the same or differently than the remaing tabs, may be left upstanding for use in attaching the frame to the housing of the enclosure.

In another disclosed embodiment, the tabs are perforated or otherwise formed within the corresponding side wall portion of the frame. Such construction extends the advantages of the present invention to the use of roll-formed channels, which are described more fully in co-pending application U.S. Ser. No. 09/243,778, as a substitute for more costly extruded weldments.

The present invention, accordingly, comprises the EMI shielded vent panel possessing the combination of elements and construction which are exemplified in the detailed disclosure to follow. Advantages of the present invention include a vent panel which exhibits reliable EMI shielding and air flow characteristics. Additional advantages include a panel construction which is economical in allowing the use of a metal stamping or roll formed frame, and which ensures good electrical contact between the shielding media and the frame without the need for additional gaskets, metal plating, or other components or operations. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein:

FIG. 6 is an assembly view showing the use of the frame tabs to attach the vent panel of FIG. 1 to the enclosure of FIG. 1;

FIG. 8A is a perspective cut-away view showing representative frame tabs which are specially-adapted for attaching the vent panel to the enclosure;

FIG. 8B is a perspective cut-away view showing each of the specially-adapted frame tabs of FIG. 8A being received through an aperture in the enclosure and positioned to interlock therewith for attaching the vent panel to the enclosure;

Figure 1:
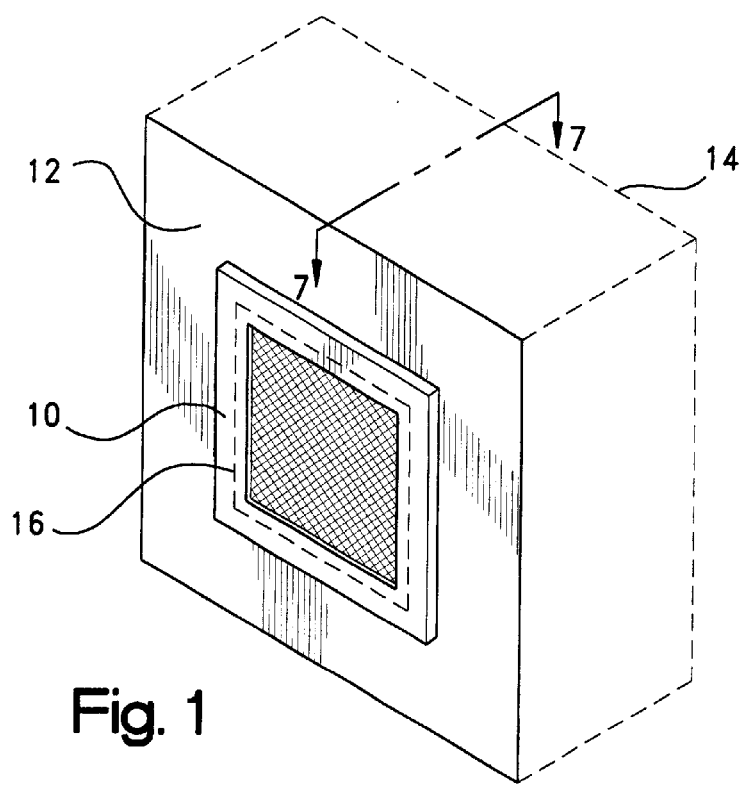
FIG. 1 is a perspective view of a representative electronics, enclosure including an EMI shielded vent panel according to the present invention.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

For the purposes of the discourse to follow, the precepts of the inventive EMI shielded vent panel, referenced at 10 in FIG. 1, herein involved are described in connection with its mounting onto a surface, 12, of a electronics enclosure, such as the EMI shielded housing shown in phantom at 14. Within this representative application, panel 10 may be mounted in a conventional manner using, for examples, screws, bolts, or other fastening members, over a corresponding opening formed within housing 14. Such opening generally will be formed as having a predefined outer margin, shown in phantom at 16, about which panel 10 borders to cover the opening in a manner providing ventilation without comprising the EMI shielding effectiveness of the housing 14. It will be appreciated, however, that aspects of the present invention may find utility in other EMI shielding applications. For example, panel 10 of the invention alternatively may be mounted onto the wall of an EMI shielded room for covering a ventilation opening thereof. Use within those such other applications therefore should be considered to be expressly within the scope of the present invention.

Figure 2:
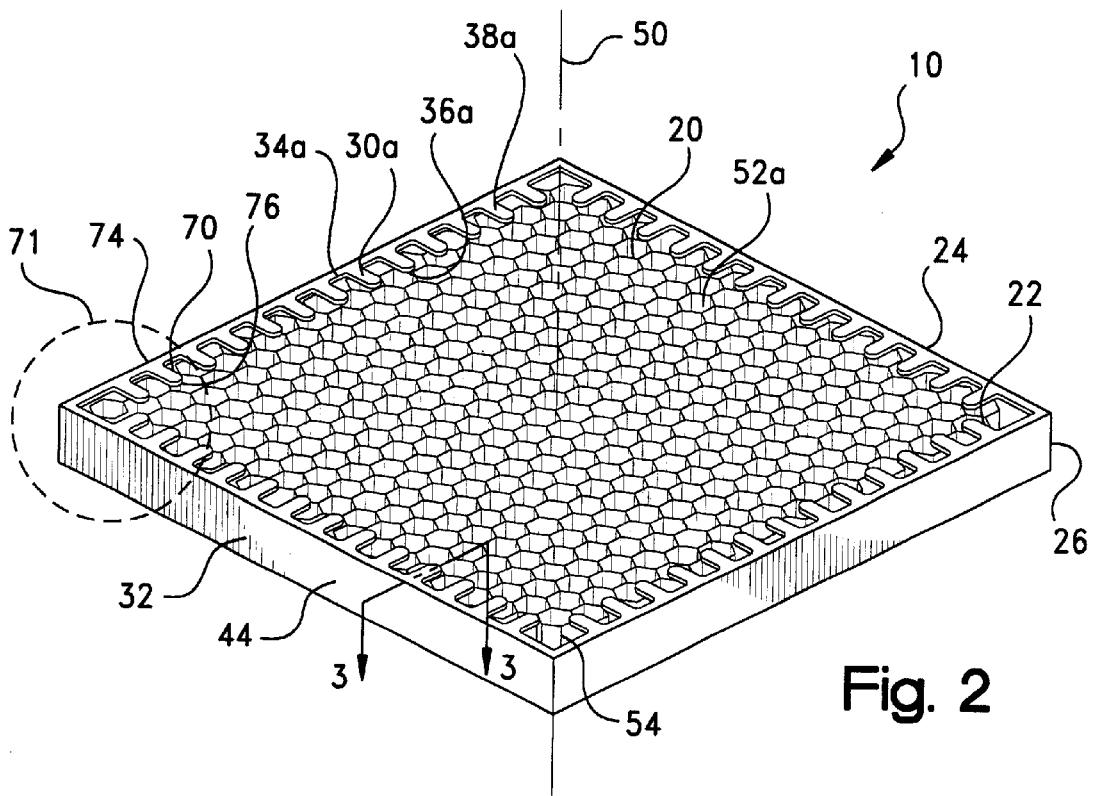
FIG. 2 is a perspective view of the EMI shielded vent panel of FIG. 1.
Figure 3:
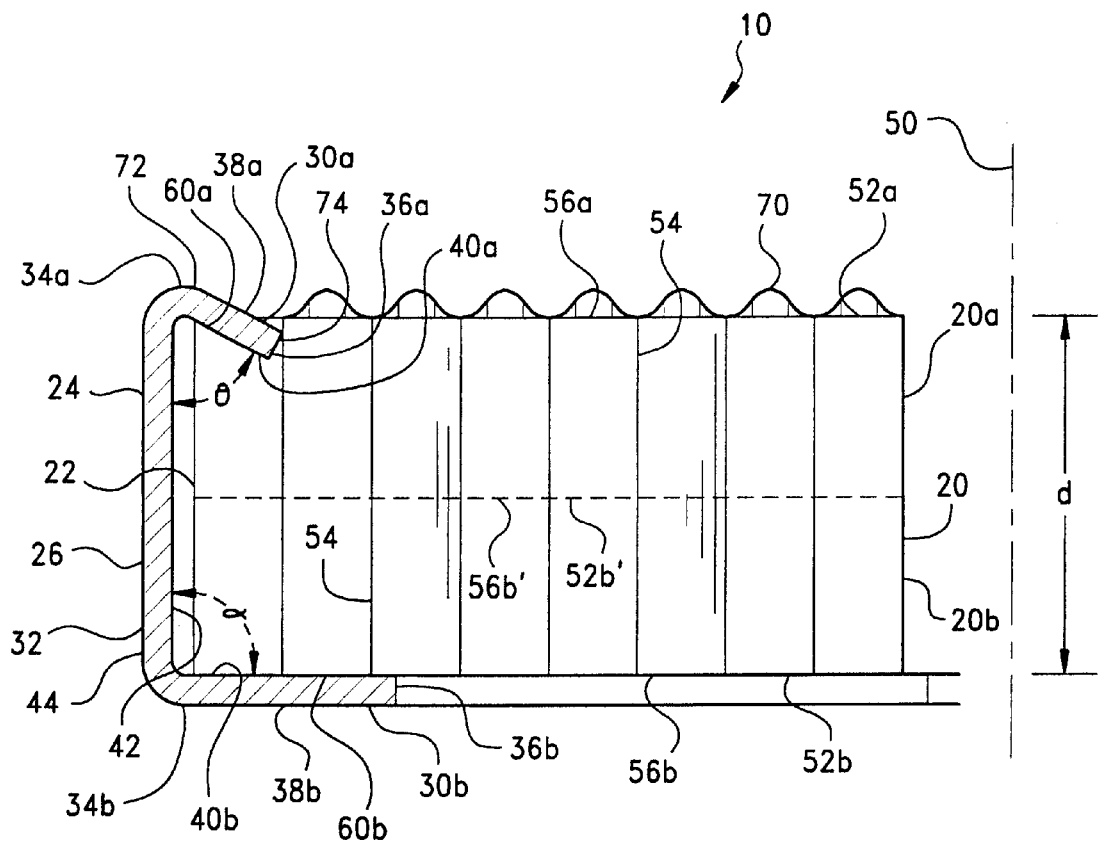
FIG. 3 is an enlarged, generally schematic cross-sectional view of the vent panel of FIG. 2 taken through line 3—3 of FIG. 2.

Referring then to the remaining figures wherein corresponding reference characters are used to designate corresponding elements throughout the several views, EMI shielded vent panel 10 of FIG. 1 reappears in the perspective view of FIG. 2. In basic construction, and as may be seen with additional reference to the cross-sectional view of FIG. 3, panel 10 includes an electrically-conductive, generally-planar media, 20, having an outer periphery, 22, which is supported within an electrically-conductive frame, 24. For illustrative purpose, frame 24 is shown to have a perimeter, 26, which defines a generally polygonal geometry sized to border the margins of a similarly dimensioned vent opening. Depending upon the configuration of the corresponding opening, however, the perimeter 26 of frame 24 may be of any closed geometry.

Frame 24 preferably is formed from a stamped, die-cut, or other sheet of 25–60 mil (0.63–1.52 mm) thick aluminum or other metal in a manner to be detailed hereinafter. In final form, however, frame 24 assumes a generally U- or C-shaped cross-sectional profile including a pair of generally parallel, oppositely-disposed side walls, 30a–b, and an elongate end wall, 32. Each of side walls 30a–b extends, respectively, intermediate a proximal edge, 34a–b, and a corresponding distal edge, 36a–b, and has, respectively, an outer surface, 38a–b, and inner surface, 40a–b. End wall 32 extends intermediate the proximal edges 34 of side walls 30, and, in turn, has an interior surface, 42, and an exterior surface, 44. Each of the inner surfaces 40a–b of side walls 30a–b is spaced-apart from the opposing inner surface 40 of the other side wall 30, and defines, respectively, angles θ and α and with the interior surface 42 of end wall 32. In the embodiment 10 of FIG. 2, angle θ is defined as an acute angle for improved media retention and electrical contact, with angle α being defined as a generally right angle.

Electrically-conductive media 20 extends along a transverse axis, 50, intermediate a pair of opposing faces, 52a–b, defining a thickness dimension, d, therebetween which may range, typically, between about ⅟₆₄–1.5 inch (0.4–38 mm). Although media 20 may be provided as a metal screen or expanded metal mesh, it more preferably is provided, as is shown in FIG. 2, as one or more layers of a honeycomb material having a hexagonal or other cellular structure which is "open" or otherwise porous to admit the flow of cooling air therethrough for the ventilation of the associated housing or other electronics enclosure. Such cellular structure of media 20, which may be formed from a corrugated sheet of a 1–5 mil (0.039–0.197 mm) thick aluminum or other metal foil, or otherwise as is described in U.S. Pat. Nos. 3,821,463, 5,895,885; and 5,910,639, includes a plurality of cells, one of which is referenced at 54. Each of the cells 54 define a corresponding ventilation passageway of the media 20 as extending through the thickness direction thereof generally along or parallel to the transverse axis 50 from, as is shown in FIG. 2 for the cell referenced at 54, a first end, 56a, which forms a segment of the media face 52a, and a second end, 56b, which forms a segment of the media face 52b. Alternatively, in the case where media 20 is provided in multiple layers, such as the layers 20a and 20b referenced in FIG. 3 which may be disposed in parallel or, more typically, perpendicularly with respect to the longitudinal directions of the cells, the cell second end 56b' forms a segment of the interface 52b'between the layers. In either case, the thickness dimension of the outer periphery 22 of media 20 is received intermediate the inner surfaces 40 of side walls 30 such that each of the walls 30 extends over a corresponding edge portion, referenced at 60a–b, respectively, of the faces 52a–b of media 20.

Optionally, a dust filter (not shown) may be employed in conjunction with media 20 as disposed parallel thereto in a series arrangement relative to the air flow direction. Such filter may be formed of a screen or a high porosity foam or the like which allows for sufficient air flow therethrough while reducing the transmission of dust or other airborne contaminants into the enclosure. The filter may be attached to the outside, relative to the enclosure, of the frame in a conventional manner, but preferably is made to be removable for easier cleaning and replacement.

Figure 4:
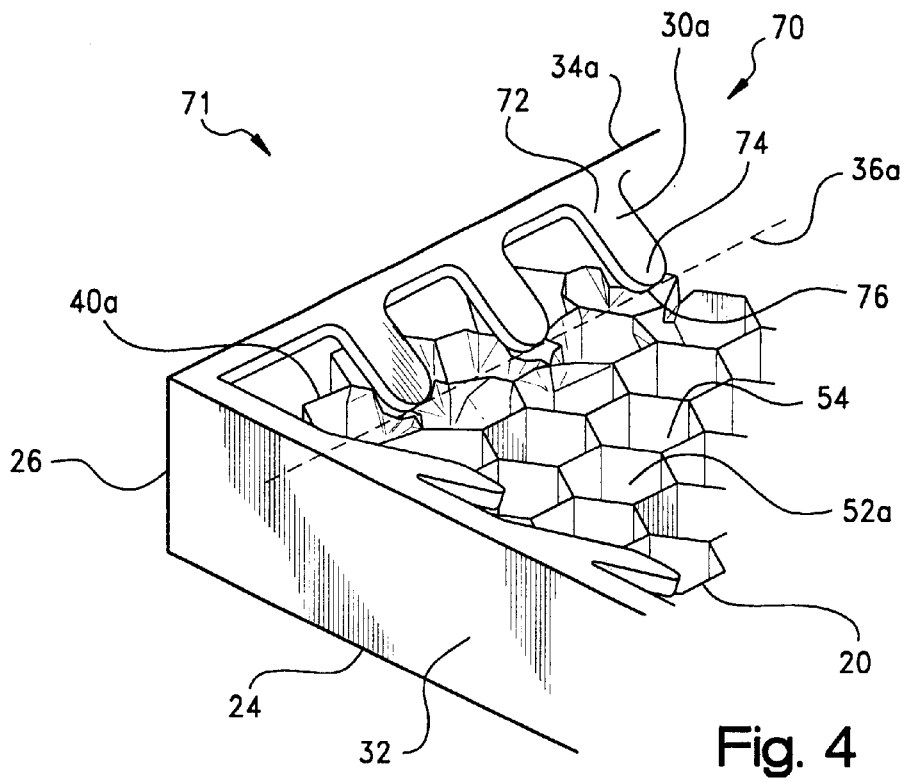
FIG. 4 is an enlarged perspective view of a portion of the vent panel of FIG. 2 showing the contact between the tabs and the honeycomb cells in enhanced detail.

Returning to FIG. 2, it may be seen that, in accordance with the precepts of the present invention, at least the side wall 30a is formed as having a series of spaced-apart tabs, one of which is referenced at 70, defined along the perimeter 26 of frame 24. As may be seen best with additional reference to FIG. 4 wherein the area of vent 10 designated at 71 in FIG. 2 is shown in enhanced detail, each of tabs 70 has a proximal end, 72, and a distal end, 74, which depends downwardly in the direction of media 22 in defining an acute angle θ (FIG. 3) with end wall 32. Such downward orientation of the tab distal ends 74 advantageously effects both the retention of media 20 within frame 24 and electrical contact therebetween. Preferably, and as is shown at 76 in FIG. 4, the distal ends of the tabs 70 are oriented to project into a corresponding cell 54 and/or to extend across one or more of the cells effecting the deflection thereof into a deformed orientation. Both such orientations of the tabs 70 provide increased surface area contact and concomitantly decreased impedance across the frame-media interface.

In the illustrated embodiment of FIG. 2, each of the tabs 70 are defined in side wall 30a as a series of finger- or comb-like projections such that proximal and distal ends 72 and 74 thereof define, respectively, the proximal and distal edges 34a and 36a of side wall 30a. That is, side wall 30a is formed as a discontinuous surface with the widthwise extent thereof being comprised substantially entirely of the tabs 70. Alternatively, the proximal extent of tabs 70 may be foreshortened such that the tabs form only the terminal portion of the widthwise extent of side wall 30a.

With continuing reference to FIG. 2, and looking sequentially to FIGS. 5A–5D, a preferred method of assembly is described in further accordance with the present invention. Advantageously, and by virtue of the described construction of vent 10, frame 24 thereof may be economically constructed from a blank which, as is shown at 80 in FIG. 5A, may be provided as a generally square, rectangular, or other polygonal planar metal stamping or other sheet of predefined margins. Particularly, sheet 80 is provided according to the invention as having an inner margin, 82, and an outer margin, 84. Inner margin 82 is of a closed geometry which is generally sized to border, i.e., either by inscribing or circumscribing, the opening 16 of the enclosure 14 of FIG. 1. Outer margin 84, in turn, is formed as including tabs 70, and as additionally including corner notches 86a–d which divide the sheet 80 into four quarter panels, 88a–d. One or more fastener holes, 90a–d, for attaching frame 24 to the enclosure also may be formed in sheet 80 adjacent, for example, corner notches 86.

Figure 5A:
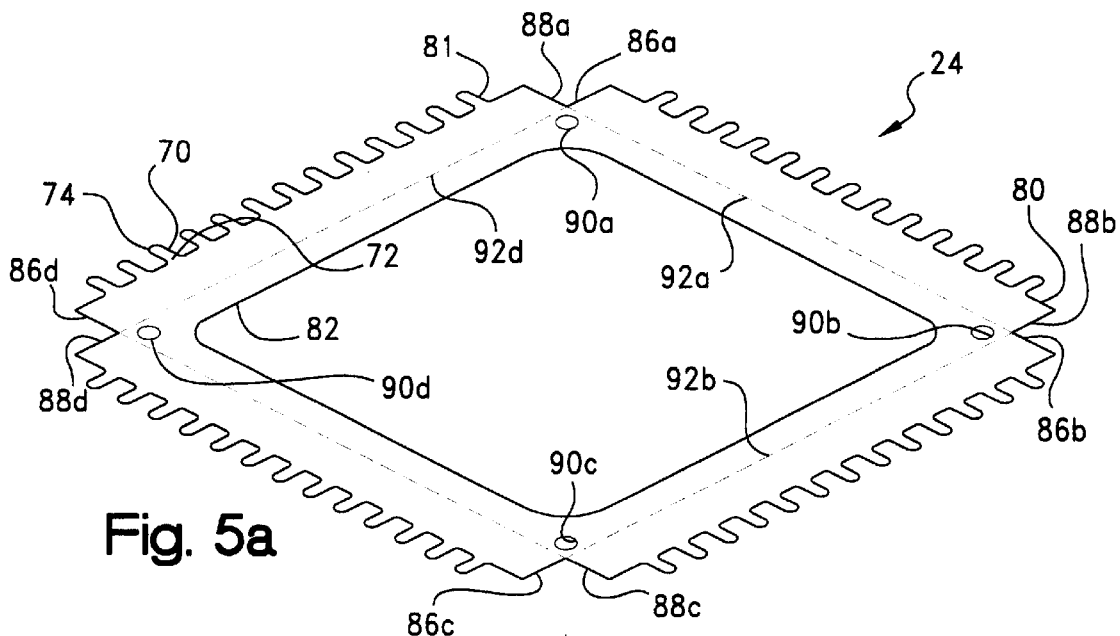
FIG. 5A is an assembly view of a blank for forming the frame of the vent panel of FIG. 2 which blank includes a plurality of finger-like tabs defined in the outer margin thereof.
Figure 5B:
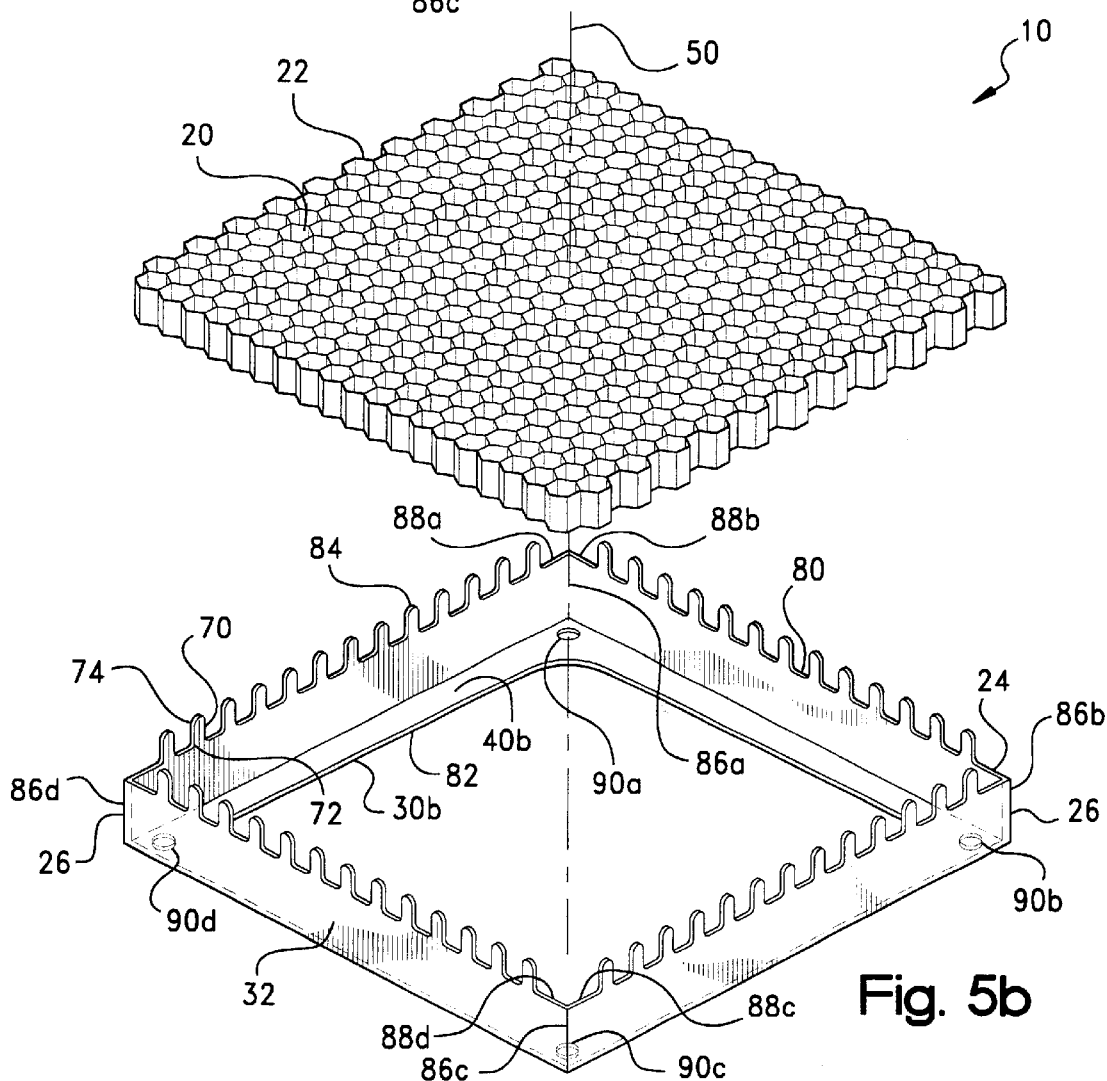
FIG. 5B is a continuing assembly view showing the blank of FIG. 5A being partially folded to receive a layer of an electrically-conductive honeycomb media.
Figure 5C:
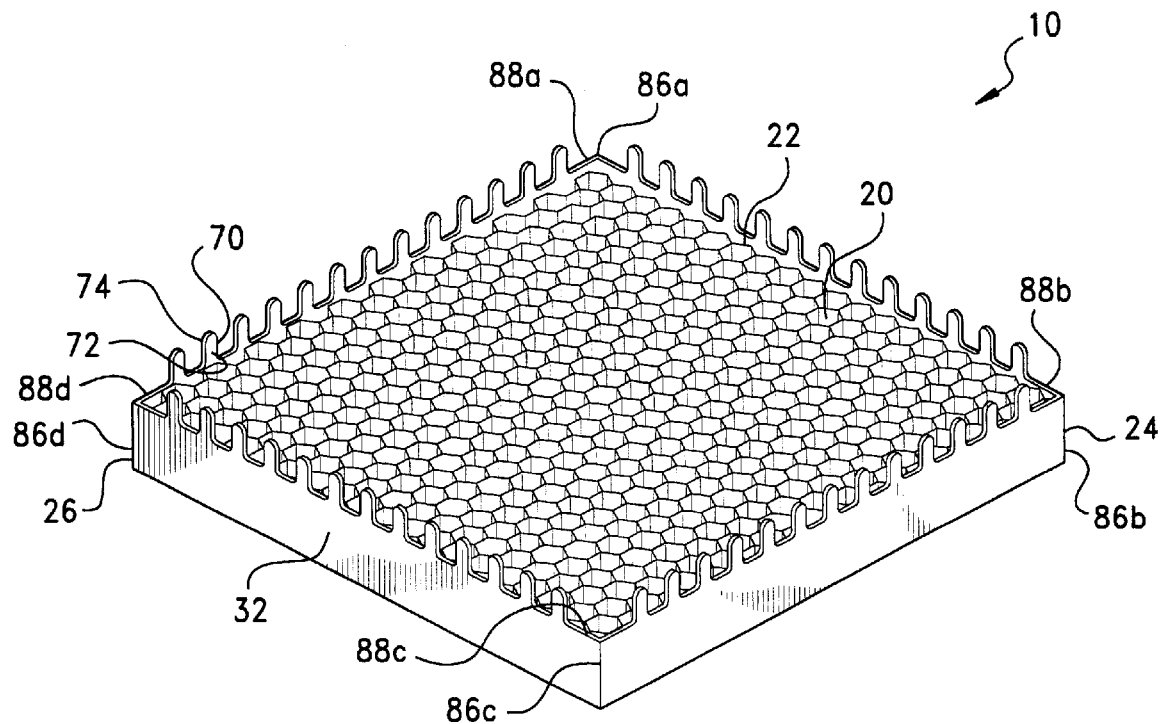
FIG. 5C is a continuing assembly view showing the partially-folded blank of FIG. 5B with the media being received therein.
Figure 5D:
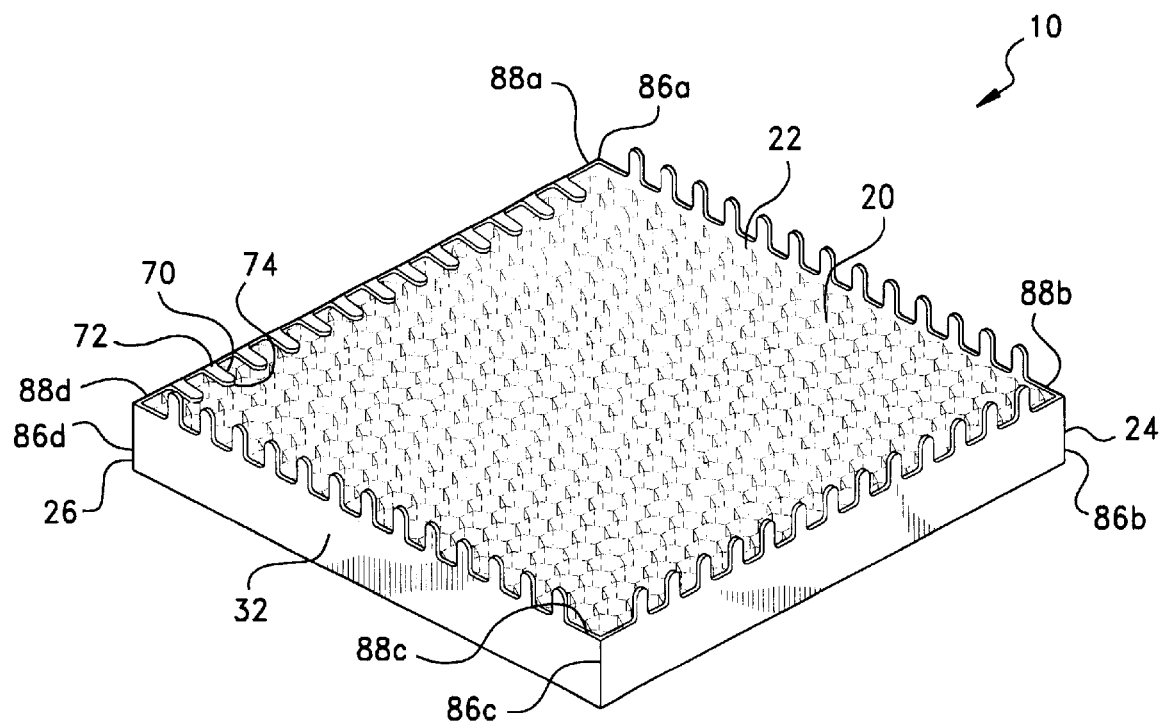
FIG. 5D is a continuing assembly view showing the folding of the tabs on one side of the blank of FIG. 5C for retaining the media and providing electrical contact therewith.

With sheet 80 being provided as shown in FIG. 5A, the assembly method may commence by folding each of the quarter panels 88 intermediate the inner and outer margins 82 and 84 thereof along, for example, the fold lines referenced in phantom at 92a–d. As may be seen in FIG. 5B, the blank of sheet 80 thereby is made to assume a configuration having a generally L-shaped cross-section which defines side wall 30b and which disposes upstanding end wall 32 generally perpendicular thereto. With sequential reference to FIGS. 5C and 5D, the outer periphery 22 of one or more layers of media 20 then may be received on the inner surface 40b of the side wall 30b, and tabs 70 folded along the proximal ends 72 thereof to retain the media 20 in the U- or C-shaped channel thereby formed between tabs 70 and side wall 30b.

The above-described manufacture of frame 24 from blank 80 may be accomplished, for example, using a brake or a series of progressive dies, or otherwise in a deep drawing operation. Tabs 70 may be folded in a press or rolled. Advantageously, the provision of tabs 70 decreases the amount of force necessary to form the second side wall of the frame and thereby minimizes any distortion to the plan dimensions thereof. Electrical contact also can be effected without crushing the media and otherwise while preserving the integrity thereof.

The outer surface 38 of one or either of the side walls 30 is disposable about the opening of the housing 14 (FIG. 1) or other enclosure in an electrically-conductive contact adjacency with the surface 12 thereof. For lowering the impedance across the frame-housing interface, an electrically conductive seal or gasket member (not shown) conventionally may be employed as mounted onto the confronting side wall outer surface 38 or as otherwise interposed between that surface and the housing surface 12. Such gasket may be constructed as having a resilient core element affording gap-filling capabilities which is either loaded, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a formed-in-place (FIP) bead of a curable, electrically-conductive silicone or urethane composition which is dispensed in a fluent state onto the surface of the frame or housing and then is cured or foamed in situ via the application of heat or with atmospheric moisture.

Figure 7:
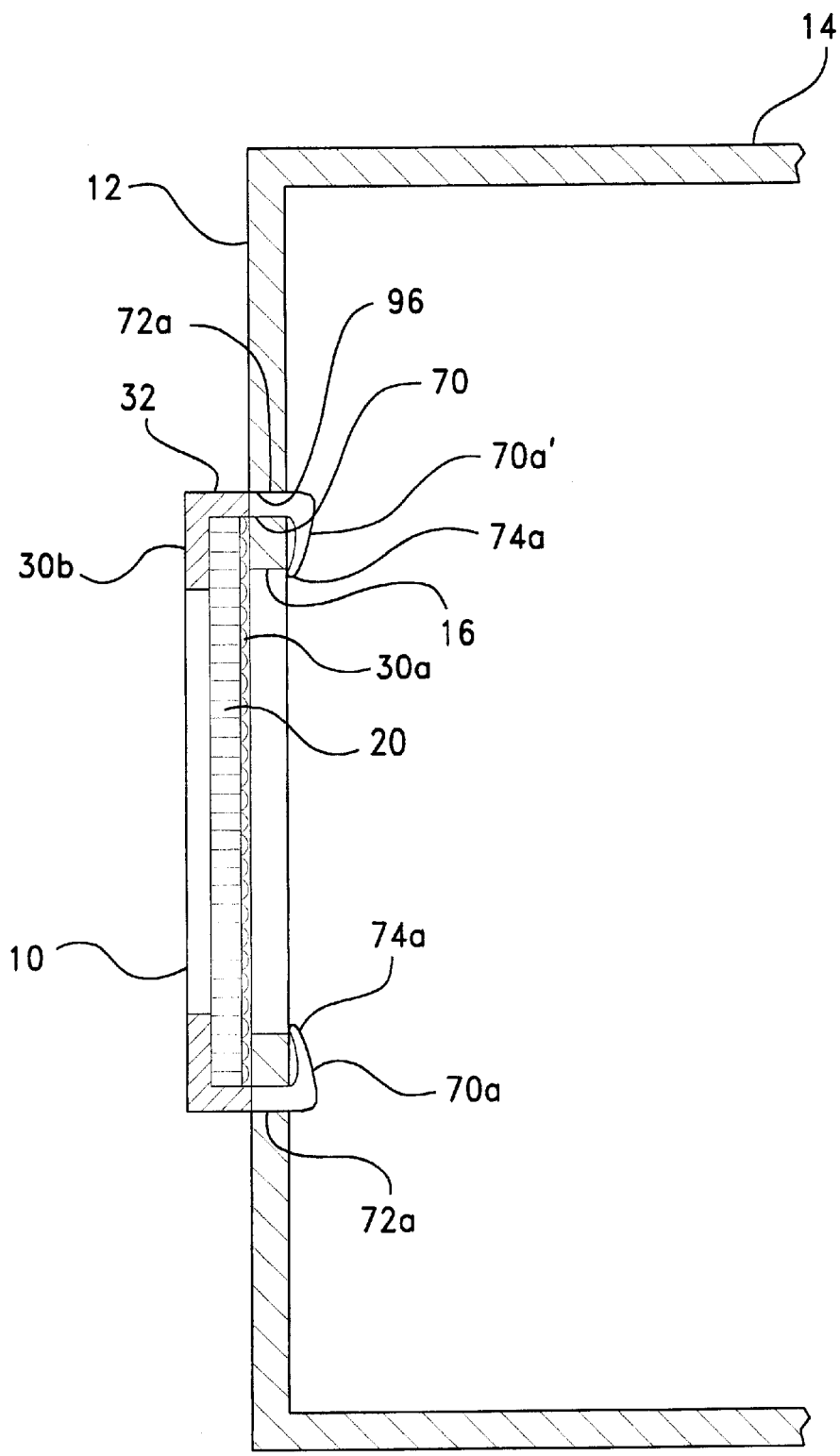
FIG. 7 is a cross-sectional view of vent panel; and enclosure assembly of FIG. 1 taken through line 7—7 of FIG. 1.

As mentioned, the panel 10 is conventionally mountable onto surface 12 of housing 14 using screws, bolts, or other fastening members which are receivable through the holes 90 (FIG. 5B) provided in frame 24. Alternatively, frame 24 may be attached to the housing 14 using an electrically conductive adhesive, or otherwise as configured for an interference fit within the housing opening. Advantageously, frame 24 also may be mounted using one or more tabs 70. In this regard, reference may be had to the assembly view of FIG. 6 wherein the several of tabs 70 referenced 70a are made to remain generally upstanding relative to the other tabs 70 so as to project outwardly from frame 24. Looking additionally to FIG. 7 wherein a cross-sectional view of the vent-enclosure arrangement of FIG. 1 is shown, each of the tabs 70a so provided may be seen to be receivable through a corresponding aperture, referenced collectively at 96, formed through the surface 12 of enclosure 14. By bending each of the tabs 70a intermediate the distal end 74a thereof and the enclosure surface 12 into the orientation shown at 70a', panel 10 thereby may be attached to the enclosure. To facilitate such attachment, tabs 70a may be sized to be longer, as is shown in FIG. 6, or as being wider or otherwise different from the remaining tabs 70. Other of tabs 70 also may be of different sizes such as, for example, to accommodate fastener holes or for other functional reasons.

Referring momentarily to FIG. 8A, alternative attachment tab configurations, in addition to the elongated, bendable projection of 70a, are shown at 70b–c as being configured for a sliding (70b) or twisting (70c) engagement. With additional reference to FIG. 8B, each of the specially-adapted, upstanding tabs 70a–b may be seen to have a corresponding proximal end, 72a–, and a corresponding distal end, 74a–. As explained previously in connection with tabs 70a, each of the tab distal ends 74a–c is receivable through a corresponding enclosure aperture 96 (FIG. 8B), and is bendable, slidable, twistable, or similarly positionable relative thereto to interlock or otherwise attach the vent panel frame 24 to the enclosure surface 12. Specifically as to slide tab 70b, such tab may be first received through a corresponding aperture 96 as is shown in phantom at 70b', with the panel 10 then being displaced to effect the interlocking engagement shown at 70b". As to twist tab 70c, such tab likewise is first received through a corresponding aperture 96, and is then twisted to effect the interlocking engagement shown at 70c'.

Figure 9:
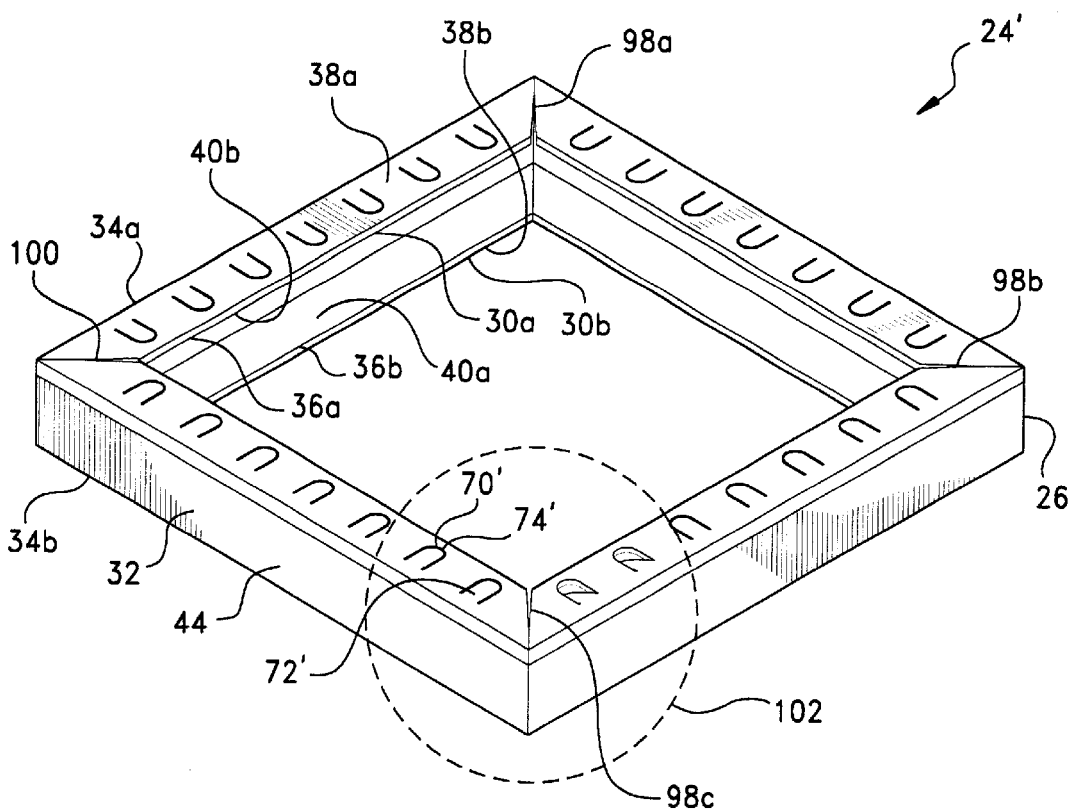
FIG. 9 is a perspective view of an alternative frame construction according to the present invention.

Turning next to FIG. 9, and alternative embodiment of frame 24 of the present invention is referenced generally at 24'. In such embodiment, frame 24' preferably is formed from a length of an aluminum or other metal channel which may be roll formed from a 25–60 mil (0.63–1.52 mm) thick sheet of aluminum or another metal. Roll forming is a cold working process which, as described in U.S. Pat. Nos.

4,354,372; 5,272,899; 5,527,625; 5,640,869, is well known in the metal forming arts. Such channel may have, as is shown, a generally U- or C-shaped cross-sectional profile including, as before, side walls 30*a–b* and end wall 32. As is described further in co-pending application U.S. Ser. No. 09/243,778, the closed geometry of frame 24' may be formed by bending the channel through the notches referenced at 98*a–c*, and then securing the ends thereof to form the mitered corner 100.

Figure 10:
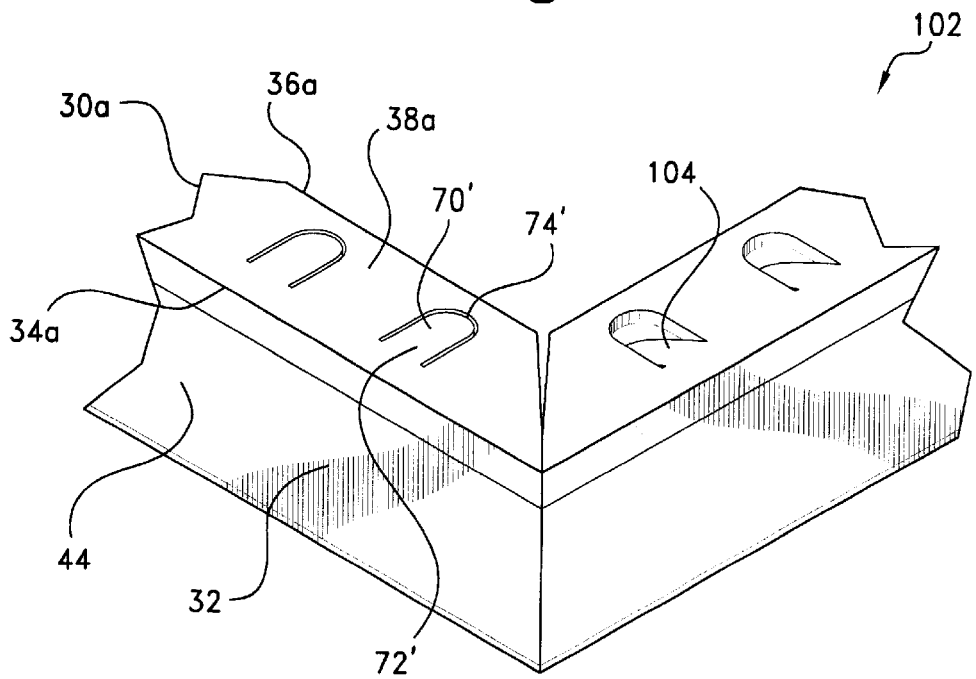
FIG. 10 is an enlarged perspective view of a portion of the frame of FIG. 9 showing the structure of the tabs defined in enhanced detail.

In accordance with the precepts of the present invention, at least the side wall 30*a* is formed as having a series of spaced-apart tabs, one of which is referenced at 70', defined along the perimeter 26 of frame 24. As may be seen best with additional reference to FIG. 10, wherein the area of frame 24' designated at 102 in FIG. 9 is shown in enhanced detail, each of the tabs 70' are defined in side wall 30*a* intermediate the proximal and distal edges 34*a* and 36*a* thereof as a series U-shaped perforations each having a proximal end, 72', and a distal end, 74'. As may be seen at 104 in FIG. 10, the tabs 70' are depressed so as to dispose the distal ends 74' thereof in a downwardly depending orientation for effecting both the retention of the media within the frame 24' and electrical contact therebetween. As with the tabs 70, the distal ends of the tabs 70' preferably are oriented to project into a corresponding cell of the media and/or to effect the deflection thereof into a deformed orientation of increased surface area contact and concomitantly decreased impedance across the frame-media interface.

Thus, an EMI shielded vent construction for electronics enclosures is described which exhibits reliable EMI shielding in ensuring the grounding of the enclosure across the vent opening. Such construction additional is especially economical to manufacture in allowing the use of a stamping or roll formed frame, and also ensuring good electrical contact between the shielding media without the need for a separate metal plating. The use of a stamped or roll formed frame construction further eliminates the need and expense of having to provide welded frame joints at the corners of the panel.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. An electromagnetic interference (EMI) shielded vent panel for disposition over a corresponding opening formed within a surface of an enclosure for electronics, said vent panel comprising:

an electrically-conductive frame having a perimeter defining a closed geometry configured to border the opening of the enclosure, said frame including a pair of opposing side walls each having a proximal and a distal edge, and an end wall which extends intermediate the proximal edges of said side walls, each of said side walls having an outer surface and an inner surface spaced-apart from the inner surface of the other of said side walls; and one or more layers of an electrically-conductive media having an outer periphery and extending along a transverse axis intermediate a pair of faces defining a thickness dimension therebetween, said media have a plurality of ventilation passageways extending through said thickness dimension generally along said transverse axis; the outer periphery of said media being retained intermediate the inner surfaces of said side walls, wherein at least one of said side walls is formed as having a series of spaced-apart first tabs defined therein along the perimeter of said frame, each of said first tabs having a proximal end and a distal end contacting said media effective to provide electrical continuity between said frame and said media.

2. The vent panel of claim 1 wherein said media comprises one or more layers of a metal foil material which is corrugated into a plurality of cells defining said ventilation passageways.

3. The vent panel of claim 2 wherein the distal ends of at least a portion of said first tabs are each oriented to project into a corresponding one of said cells.

4. The vent panel of claim 3 wherein said one of said cells is deflected under the distal end of a corresponding one of said first tabs into a deformed orientation of increased electrical contact surface area.

5. The vent panel of claim 1 wherein said first tabs are defined in said one of said side walls as a series of finger-like projections.

6. The vent panel of claim 5 wherein the proximal ends of said projections define the proximal edge of said one of said side walls, and wherein the distal ends of said projections define the distal edge of said one of said side walls.

7. The vent panel of claim 1 wherein said first tabs are defined in said one of said side walls intermediate the proximal and distal edges thereof.

8. The vent panel of claim 1 wherein one or more second tabs are defined in said one of said side walls, each of said second tabs having a proximal end and a distal end received through a corresponding aperture formed through the surface of said enclosure, and each being positionable with respect to each said corresponding aperture to attach said vent panel to the surface of said enclosure.

9. The vent panel of claim 8 wherein each of said second tabs is defined in said one of said side walls as being positionable by bending, sliding, or twisting.

10. A method of making an electromagnetic interference (EMI) shielded vent panel for disposition over a corresponding opening formed within a surface of an enclosure for electronics, said panel including a frame and said method comprising the steps of:

(a) providing a blank for said frame formed of a generally planar sheet of an electrically-conductive material, said sheet having an inner margin of a closed geometry configured to border the opening of the enclosure, and an outer margin formed as defining a series of spaced-apart first tabs, each of said first tabs having a proximal end and a distal end;

(b) folding said blank intermediate said inner margin and said outer margin to define a side wall having an inner surface, and a generally perpendicular end wall portion extending between said side wall and the proximal ends of said first tabs;

(c) receiving one or more layers of an electrically-conductive media on the inner surface of said side wall, said media having an outer periphery and extending along a transverse axis intermediate a pair of faces defining a thickness dimension therebetween, said media have a plurality of ventilation passageways extending through said thickness dimension generally along said transverse axis; and (d) folding said blank along the proximal ends of said first tabs to retain the outer periphery of said media between said tabs and said side wall, the distal ends of said first tabs contacting said media effective to provide electrical continuity between said frame and said media.

11. The method of claim 10 wherein said media received in step (c) comprises one or more layers of a metal foil material which is corrugated into a plurality of cells defining said ventilation passageways.

12. The method of claim 11 wherein said first tabs are folded in step (d) such that the distal ends of at least a portion of said first tabs are each oriented to project into a corresponding one of said cells.

13. The method of claim 12 wherein said one of said cells is deflected under the distal end of a corresponding one of said first tabs into a deformed orientation of increased electrical contact surface area.

14. The method of claim 10 wherein said first tabs are defined in the outer margin of said blank of step (a) as a series of finger-like projections.

15. The method of claim 10 wherein said blank is provided in step (a) as having one or more- second tabs defined in the outer margin thereof, each of said second tabs having a proximal end and a distal end and being oriented in step (d) to project outwardly from said frame, said method further comprising the additional steps of:

(e) receiving each of said second tabs through a corresponding -aperture formed through the surface of said enclosure; and (f) positioning each of said second tabs with respect to each said corresponding aperture to attach said vent panel to the surface of said enclosure.

16. The method of claim 15 wherein each of said second tabs is positioned in step (f) by bending, sliding, or twisting.

17. The EMI shielded vent panel made by the method of claim 10.

* * * * *